United States Patent
Ebbecke

(10) Patent No.: US 11,056,628 B2
(45) Date of Patent: Jul. 6, 2021

(54) METHOD OF PRODUCING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventor: Jens Ebbecke, Rohr in Niederbayern (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/348,609

(22) PCT Filed: Feb. 12, 2018

(86) PCT No.: PCT/EP2018/053440
§ 371 (c)(1),
(2) Date: May 9, 2019

(87) PCT Pub. No.: WO2018/149788
PCT Pub. Date: Aug. 23, 2018

(65) Prior Publication Data
US 2020/0066953 A1 Feb. 27, 2020

(30) Foreign Application Priority Data
Feb. 16, 2017 (DE) .................... 10 2017 103 164.2

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/0075* (2013.01);
(Continued)

(58) Field of Classification Search
CPC . H01L 33/62; H01L 33/0093; H01L 33/0075; H01L 33/20; H01L 33/40; H01L 33/007; H01L 25/0753
See application file for complete search history.

(56) References Cited

U.S. PATENT DOCUMENTS

2003/0104678 A1 6/2003 Kelly et al.
2008/0113462 A1* 5/2008 Kim .................... H01L 33/0093
438/33
(Continued)

FOREIGN PATENT DOCUMENTS

DE          196 40 594 A1   4/1998
DE    10 2010 048 617 A1   4/2012
WO         2010/136326 A1  12/2010

*Primary Examiner* — Herve-Louis Y Assouman
(74) *Attorney, Agent, or Firm* — DLA Piper LLP (US)

(57) ABSTRACT

A method of manufacturing an optoelectronic semiconductor chip includes providing a growth substrate, growing a semiconductor layer sequence on the growth substrate, depositing a metallization on a side of the semiconductor layer sequence remote from the growth substrate, depositing a layer on the metallization, coupling a carrier to the layer on a side of the layer remote from the semiconductor layer sequence, separating the growth substrate from the semiconductor layer sequence, depositing an electrically conductive layer on a side of the semiconductor layer sequence facing away from the carrier, separating the carrier from the layer, thereby forming a layer stack with the metallization, the semiconductor layer sequence, the electrically conductive layer and a coupling layer including at least a part of a further material of the layer remaining on a side of the metallization remote from the semiconductor layer sequence, and coupling the layer stack to a chip carrier.

7 Claims, 3 Drawing Sheets

(51) Int. Cl.
*H01L 33/40* (2010.01)
*H01L 33/00* (2010.01)
*H01L 33/20* (2010.01)

(52) U.S. Cl.
CPC .......... *H01L 33/0093* (2020.05); *H01L 33/20* (2013.01); *H01L 33/40* (2013.01)

(56) References Cited

U.S. PATENT DOCUMENTS

| | | | |
|---|---|---|---|
| 2009/0224282 A1* | 9/2009 | Kamei | H01L 33/42 257/103 |
| 2010/0055873 A1* | 3/2010 | Yan | H01L 33/0093 438/458 |
| 2013/0264598 A1 | 10/2013 | Hertkorn et al. | |
| 2014/0377895 A1 | 12/2014 | Seong | |
| 2015/0008389 A1* | 1/2015 | Hu | H01L 33/005 257/13 |
| 2016/0372893 A1* | 12/2016 | McLaurin | H01S 5/32341 |
| 2017/0117257 A1* | 4/2017 | Lee | H01L 33/20 |
| 2017/0288102 A1* | 10/2017 | Farrens | H01L 33/0093 |

* cited by examiner

METHOD OF PRODUCING AN OPTOELECTRONIC SEMICONDUCTOR CHIP AND OPTOELECTRONIC SEMICONDUCTOR CHIP

TECHNICAL FIELD

This disclosure relates to a method of manufacturing an optoelectronic semiconductor chip and an optoelectronic semiconductor chip.

BACKGROUND

There is a need to provide a method of manufacturing an optoelectronic semiconductor chip that allows simple and reliable fabrication, particularly for small chips, and an optoelectronic semiconductor chip that is easy to manufacture.

SUMMARY

I provide a method of manufacturing an optoelectronic semiconductor chip including providing a growth substrate, growing a semiconductor layer sequence on the growth substrate, the semiconductor layer sequence including an active layer that generates radiation and is arranged between a first and a second semiconductor region, depositing a metallization on a side of the semiconductor layer sequence remote from the growth substrate, depositing a layer on the metallization, the layer including a semiconductor containing nitrogen and a further material, coupling a carrier to the layer on a side of the layer remote from the semiconductor layer sequence, separating the growth substrate from the semiconductor layer sequence, depositing an electrically conductive layer on a side of the semiconductor layer sequence facing away from the carrier, separating the carrier from the layer by laser radiation through the carrier, thereby forming a layer stack with the metallization, the semiconductor layer sequence, the electrically conductive layer and a coupling layer including at least a part of the further material of the layer remaining on a side of the metallization remote from the semiconductor layer sequence after separating, and coupling the layer stack to a chip carrier by the coupling layer so that the chip carrier and the layer stack are electrically conductively coupled to one another by the further material.

I also provide an optoelectronic semiconductor chip including a chip carrier, a layer stack disposed on a surface of the chip carrier, including starting at the chip carrier: a coupling layer including indium or gallium and electrically coupling the layer stack to the chip carrier, a metallization, a semiconductor layer sequence including an active layer that generates radiation and is between a first and a second semiconductor region, and an electrically conductive layer.

I further provide a layer structure including a semiconductor layer sequence with an active layer between a first semiconductor region and a second semiconductor region, wherein a metallization is applied on the first semiconductor region, a layer is applied on a side of the metallization facing away from the semiconductor layer sequence, and the layer contains nitrogen and a further material.

Figure 1:
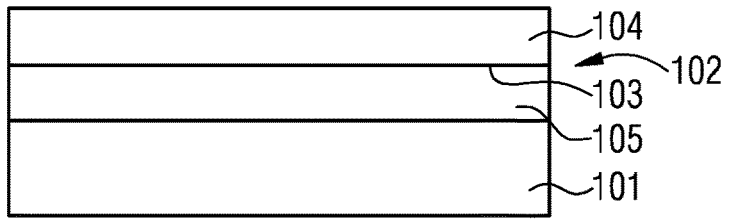
FIGS. 1 to 8 show different method steps of an optoelectronic semiconductor chip fabrication method according to an example.

REFERENCE SIGNS 100 optoelectronic semiconductor chip
101 growth substrate
102 semiconductor layer sequence
103 active layer
104 first semiconductor region
105 second semiconductor region
106 metallization
107 opposite side of semiconductor layer sequence
108 layer
109 nitrogen
110 further material
111 opposite side of the layer
112 electrically conductive layer
113 laser radiation
114 layer stack
115 coupling layer
116 opposite side of metallization
117 chip carrier
118 thickness
119 direction of growth
120 plurality of contact areas
121 edge length transverse to stacking direction
122 stacking direction
123 carrier
124 opposite side of semiconductor layer sequence
125 surface
126 thickness
127 detachment tool

DETAILED DESCRIPTION

My optoelectronic semiconductor chip, for example, is a radiation-emitting optoelectronic semiconductor chip in operation. The semiconductor chip can, for example, be a light emitting diode chip or a laser diode chip. The optoelectronic semiconductor chip is particularly capable of generating light during operation.

My method of fabricating an optoelectronic semiconductor chip may comprise providing a growth substrate. For example, the growth substrate is a nitride compound semiconductor. In particular, the growth substrate is made of sapphire, silicon carbide or gallium nitride. The growth substrate is particularly suitable for thin films for the optoelectronic semiconductor chip.

According to the application, a layer is in particular an area of the semiconductor chip having a planar expansion perpendicular to a growth direction or a stacking direction of the optoelectronic semiconductor chip. Expansion of the layer transverse to the growth direction is greater than expansion of the layer along the growth direction. A layer can have one or more layers of semiconductor material or other materials such as metal.

A semiconductor layer sequence may be grown on the growth substrate. The semiconductor layer sequence may comprise in particular an active layer that generates radiation between a first and a second semiconductor region. For example, the first semiconductor region is an n-type semiconductor region and the second semiconductor region is a p-type semiconductor region. The n-type semiconductor range is n-conductive. The p-type semiconductor range is p-conductive. During operation of the optoelectronic semiconductor chip, for example, electromagnetic radiation is generated in the active area. The electromagnetic radiation is generated by recombination of charge carriers. The semiconductor layer sequence, for example, is based on a nitride compound semiconductor material. Other semiconductor materials are also possible. The semiconductor layer sequence is in particular an epitaxially grown semiconductor layer sequence.

A metallization may be applied to a side of the semiconductor layer sequence facing away from the growth substrate. The metallization is, for example, a p-metallization that contacts the second semiconductor region during operation.

A layer may be applied to the metallization. The layer may contain a semiconductor. The semiconductor, for example, is a compound semiconductor such as indium nitride. The layer may contain a semiconductor to enable coupling with another semiconductor later in the manufacturing method, in particular by semiconductor bonding. The layer may be applied to the metallization by a sputtering process or a CVD process, for example. The layer may be monocrystalline. The layer may not be monocrystalline, but may be polycrystalline.

A carrier may be coupled with the layer on one side of the layer facing away from the semiconductor layer sequence. The carrier is in particular made of a semiconductor, for example, silicon.

The growth substrate may be detached from the semiconductor layer sequence. By separating the growth substrate, a side of the semiconductor layer sequence facing away from the carrier is exposed for further processing.

An electrically conductive layer may be applied to the side of the semiconductor layer sequence facing away from the carrier. The electrically conductive layer enables the first semiconductor region to be contacted. With my manufacturing method, it is possible to produce a so-called surface mountable semiconductor chip, an SMD chip. For example, an n-conducting metal or an indium tin oxide is applied as an electrically conductive layer.

The carrier may be detached from the layer by laser radiation. The laser radiation may be radiated in particular through the carrier. A layer stack may be formed by removing the carrier. The layer stack may comprise the metallization, the semiconductor layer sequence, the electrically conductive layer and a coupling layer. The coupling layer may contain at least a part of the further material of the layer, which remains on one side of the metallization opposite to the semiconductor layer sequence after detachment. By irradiating the laser radiation, the nitrogen contained in the layer becomes gaseous. The gaseous nitrogen contributes to reducing the adhesion between the carrier and the layer or metallization. In particular, it is possible that the gaseous nitrogen is sufficient to release the carrier from the layer or metallization.

The layer stack may be coupled to a chip carrier by the coupling layer so that the chip carrier and the layer stack are electrically conductively coupled to each other by the further material. The further material, for example, indium thus serves as a connecting material, for example, as a kind of solder for the electrical and/or mechanical connection of the layer stack with the chip carrier. After irradiation and after the gaseous nitrogen has evaporated, the remaining material remains at least partially on the metallization. The further material is selected so that it has a good electrical conductivity. This enables efficient electrical coupling of the layer stack with the chip carrier by the further material remaining on the metallization.

My method of fabricating an optoelectronic semiconductor chip may involve providing a growth substrate. A semiconductor layer sequence may be grown on the growth substrate, the semiconductor layer sequence may comprise an active layer that generates radiation between a first and a second semiconductor region. Metallization may be applied to a side of the semiconductor layer sequence facing away from the growth substrate. A layer may be applied to the metallization. The layer may have a semiconductor comprising nitrogen and a further material. A carrier may be coupled to the layer on a side of the layer facing away from the semiconductor layer sequence. The growth substrate may be separated from the semiconductor layer sequence. An electrically conductive layer may be applied to a side of the semiconductor layer sequence facing away from the carrier. The carrier may be detached from the layer by laser radiation through the carrier. This forms a layer stack comprising the metallization, the semiconductor layer sequence, the electrically conductive layer and a coupling layer. In addition, the semiconductor layer sequence may comprise at least a part of the further material of the layer which, after separating, remains on a side of the metallization facing away from the semiconductor layer sequence. The layer stack may be coupled to a chip carrier by the coupling layer, so that the chip carrier and the layer stack are electrically conductively coupled to each other by the further material.

One of my manufacturing methods is based on the following considerations. In surface-mountable components, layer stacks are lifted from the carrier and placed on the final chip carrier. This is also used for optoelectronic semiconductor chips. Especially for semiconductor chips with small dimensions, especially small edge lengths of less than 150 µm, for example, less than 100 µm, conventional methods cannot be used reliably. The semiconductor chip must be detached from the carrier and therefore the holding forces of a detachment tool on the semiconductor chip are greater than the attraction forces between the layer stack and the carrier. For this purpose it is possible, for example, to induce mutual charges into the surface layers of the semiconductor layer sequence by large voltages and to use the resulting attractive forces for detachment and holding with the detachment tool.

My manufacturing method makes use, among other things, of the idea that a thin layer, in particular of indium nitride, is applied before the carrier is applied. This layer is used to couple the carrier by semiconductor to semiconductor adhesion to the carrier. After removing the growth substrate and processing the side of the semiconductor layer sequence facing away from the carrier, the SMD process can be performed. A detachment tool is applied to the electrically conductive layer and holding forces are exerted, for example, by adhesive bonding, an adhesive film, electrical voltages or other possibilities that allow the semiconductor layer sequence and the other layers to be held. Subsequently, the laser beam is irradiated to start the laser lift-off process in the layer. The laser light is irradiated through the carrier formed in particular from a semiconductor. The nitrogen, having become gaseous through the laser energy, helps to separate the layer stack from the carrier. The material, especially the indium remaining in the layer stack subsequently contributes to good electrical contact with the chip carrier on which the layer stack is placed.

This makes it possible to significantly reduce the forces required to hold and remove the layer stack from the carrier compared to conventional processes. In particular, the gaseous nitrogen reduces the adhesive forces between the carrier and the layer stack to such an extent that only the dead weight of the semiconductor layer stack has to be held by the detachment tool and no larger forces are required. As an additional synergetic advantage, indium, which remains even after the laser lifting process, contributes to good ohmic contact with the chip carrier.

The layer may be applied from a material having a smaller band gap than the carrier. Thus, it is reliably possible to irradiate the laser radiation through the carrier into the material. In particular, the laser radiation is absorbed by the material of the layer.

The layer may have a thickness in the direction of the growth direction of the semiconductor layer sequence of 0.5 nm to 150 nm. For example, the layer has a thickness of 1 nm to 100 nm. The layer is thin enough to allow reliable outgassing of the nitrogen during laser irradiation. In addition, the remaining coupling layer is sufficiently thin so that the further material remains on the layer stack.

The layer may be formed from indium nitride. The layer may contain in particular indium nitride or may be made of indium nitride. Alternatively, the layer is made of gallium nitride or has gallium nitride. The material used for the coating depends in particular on the carrier used. In particular, the material for the layer has a smaller band gap than the carrier used.

The temperature of the coupling layer may be kept higher than the melting point of the further material after the carrier has been separated until it is coupled to the chip carrier. For example, the temperature is maintained above 146° C. Thus, the indium remains liquid and contributes directly to the electrical and mechanical coupling with the chip carrier.

The layer may be in direct contact with the carrier before release of the carrier. In particular, there are no intermediate layers of other materials between the layer and the carrier.

The metallization may be applied to the entire surface of the semiconductor layer sequence on the side facing away from the growth substrate. The layer may be applied over the entire surface of the metallization. Subsequently, the layer and the metallization may be jointly removed in areas to form a plurality of contact areas. This makes it easy and efficient to structure the layer. The layer is structured together with the metallization.

The layer stack may be structured before the carrier is separated so that it has an edge length transverse to the stacking direction of less than 150 μm, in particular less than 100 μm. The edge length, for example, is greater than 1 μm. Thus, a relatively small optoelectronic semiconductor chip is formed. These can be used, for example, for high-resolution video walls and other display devices such as displays.

The laser radiation may be irradiated with a wavelength that lies in the infrared range and is absorbed by the layer. In particular, the wavelength is 1900 nm or 1500 nm. The wavelength of the laser radiation is chosen so that it penetrates the carrier as well as possible and is absorbed as little as possible in the carrier.

I also provide an optoelectronic semiconductor chip. The optoelectronic semiconductor chip is manufactured, in particular, by at least one example of the manufacturing method. Accordingly, all features of the optoelectronic semiconductor chip are also applicable to the method and vice versa.

The optoelectronic semiconductor chip may have a chip carrier. The chip carrier may be used in particular to support semiconductor layers and/or for electrical contacting.

The optoelectronic semiconductor chip may have a layer stack arranged on a surface of the chip carrier.

The layer stack may have a coupling layer containing indium or gallium starting at the chip carrier. The coupling layer may electrically couple the layer stack to the chip carrier. The layer stack may comprise a metallization.

The layer stack thereon may comprise a semiconductor layer sequence comprising an active layer that generates radiation between a first and a second semiconductor region.

An electrically conductive layer may be applied to the semiconductor layer sequence.

An optoelectronic semiconductor chip may have a chip carrier. The semiconductor chip may have a layer stack arranged on a surface of the chip carrier. Starting at the chip carrier, the layer stack may comprise a coupling layer, a metallization, a semiconductor layer sequence and an electrically conductive layer. The coupling layer may contain indium or gallium and may electrically couple the layer stack to the chip carrier. The semiconductor layer sequence may have an active layer that generates radiation between a first and a second semiconductor region.

The optoelectronic semiconductor chip has the coupling layer containing indium in particular, for electrical and/or mechanical coupling of the layer stack with the chip carrier. Thus, the optoelectronic semiconductor chip can be easily manufactured using an SMD process and a laser lift off, which leaves indium, that then contributes to coupling the layer stack with the chip carrier in the finished component.

The coupling layer may have a thickness in the direction of the stacking direction of less than 150 nm. For example, the coupling layer has a thickness in the direction of the stacking direction of 0.5 nm to 150 nm, for example, 1 nm to 150 nm, for example, 1 nm to 100 nm, preferably less than 10 nm.

The layer stack may have an edge length transverse to the stacking direction less than 150 μm, in particular less than 100 μm. The edge length, for example, is greater than 1 μm. Thus, a relatively small light-emitting diode is formed.

Further advantages, characteristics and further training result from the following examples of execution explained in connection with the figures.

Same, similar or equivalent elements can be provided with the same reference signs across figures. The figures are not true to scale. In particular, different layers may be excessively thick or large, for example, to allow a better understanding.

FIG. 1 shows a growth substrate 101. The growth substrate is in particular an n-conducting substrate. On the growth substrate 101 a semiconductor layer sequence 102 is applied, especially it is grown epitaxially.

The semiconductor layer sequence 102 is in particular a so-called thin-film semiconductor layer sequence. The semiconductor layer sequence 102 has an active layer 103 between a first semiconductor region 104 and a second semiconductor region 105. For example, the first semiconductor region 104 is a p-doped layer. The second semiconductor region 105, for example, is an n-doped layer.

When a voltage is applied during operation, electromagnetic radiation is generated in the active layer 103, for example, in the visible range, in the UV range or in the infrared range. The semiconductor layer sequence 102 is used in particular for a surface-mountable light-emitting diode (LED).

Figure 2:
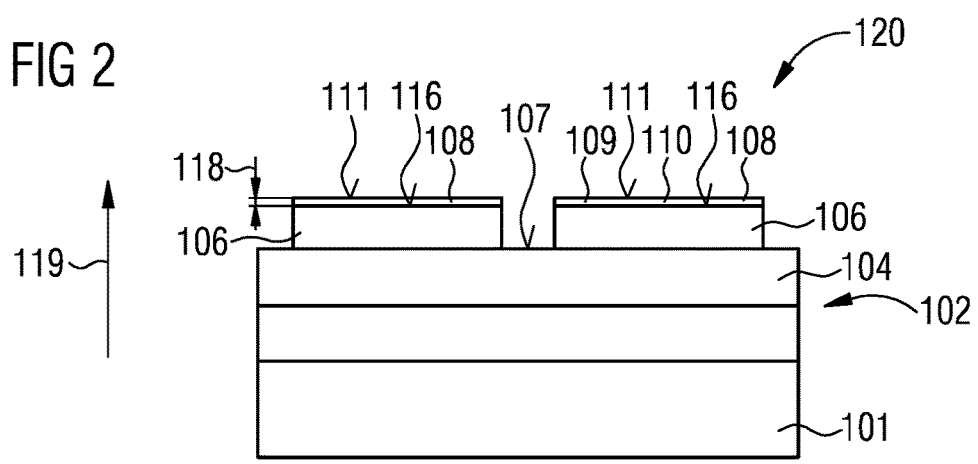

FIG. 2 shows the semiconductor layer sequence 102, to which a metallization 106 was applied. The metallization 106 was applied to a side 107 of the semiconductor layer sequence facing away from the growth substrate 101. Along a growth direction 119, the metallization 106 is applied to the first semiconductor region 104. The metallization is especially made of a p-conductive material.

A layer 108 is applied to one side 116 of the metallization 106 facing away from the semiconductor layer sequence 102. In particular, layer 108 is applied directly to metallization 106. Layer 108 and metallization 106 have in particular a common contact surface.

Layer 108 contains in particular nitrogen 109 and a further material 110. The further material is gallium or indium, for example. For example, layer 108 is an indium nitride layer. According to another example, layer 108 is a gallium nitride layer.

Metallization 108, for example, is applied over the entire surface of the first semiconductor region 104. Subsequently, for example, layer 108 is applied over the entire surface of metallization 106. Entire surface means that a large part of the surface on which the layers are applied is covered. Subsequently, metallization 106 and layer 108 are structured together to form a plurality of 120 contact areas as shown in FIG. 2. FIG. 2 shows two contact areas as examples. According to further examples it is also possible to form only one contact area or more than two contact areas. The contact areas each have metallization 106 and layer 108.

The layer 108 is applied with a thickness of 118, in particular more than 1 nm and less than 100 nm. The thickness 118 is measured in particular along the growing direction 119.

The layer 108 is deposited by a sputtering process or a CVD process, for example. Other methods of applying layer 108 are also possible that allow thin layers to be formed.

Figure 3:
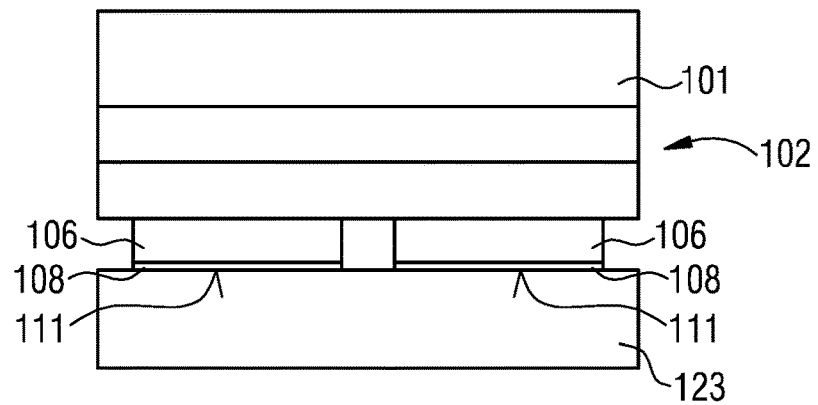
Figure 9:
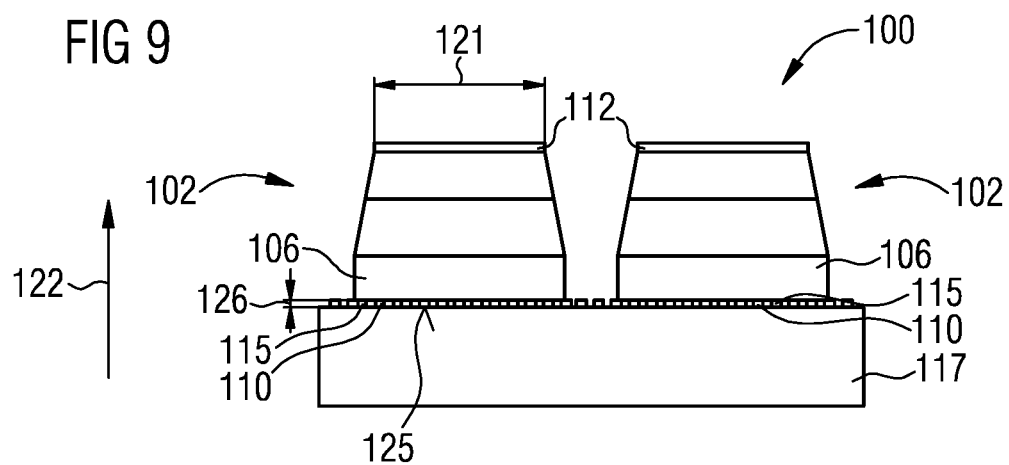
FIG. 9 shows an optoelectronic semiconductor chip according to an example.

The layer 108 contains nitrogen used in the following method to form a gas. The layer 108 comprises a semiconductor and to adhere well in the subsequent method with a carrier 123, as shown in FIG. 3, which is also made of a semiconductor. The layer 108 contains in particular indium used in the following method as a kind of solder to electrically couple the metallization 106 to a chip carrier 117 as shown in FIG. 9. Indium is advantageous because it has a low melting point and good electrical conductivity.

Figure 7:
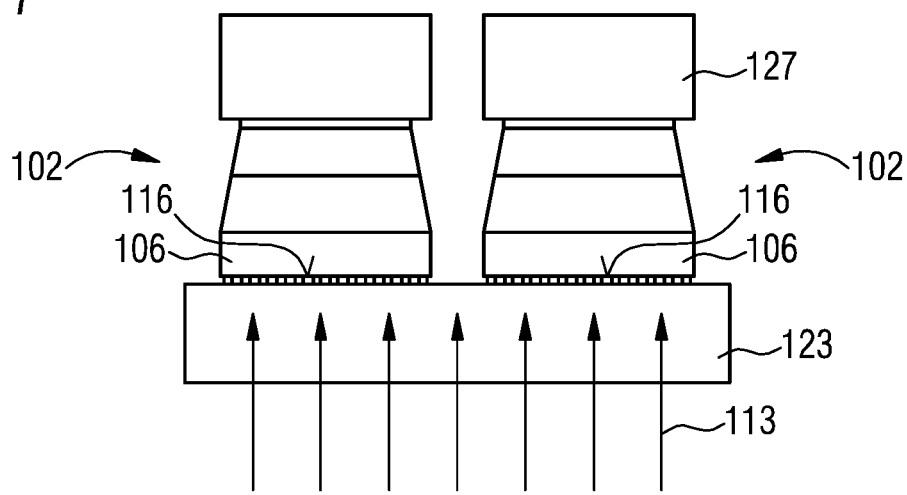

The layer 108 is made of a material having a comparatively small band gap. Indium nitride has a sufficiently small band gap. Thus, laser radiation 113 as shown in FIG. 7, having a comparatively long wavelength and a small optical energy, can be used in the following method. Thus, the laser radiation 113 is not absorbed or is absorbed as little as possible in the carrier 123.

FIG. 3 shows the carrier 123 that was applied to a side 111 of layer 108 facing away from the growth substrate 101. In particular, the carrier 123 is applied directly to layer 108. The carrier 123 and layer 108 have in particular a common contact surface. The carrier 123 holds by semiconductor-semiconductor-bond at the layer 108.

The carrier 123, for example, is made of silicon. The semiconductor bonding method (semiconductor-semiconductor bond) is used to bond layer 108 to carrier 123. According to further examples, the carrier 123 is made of gallium arsenide, germanium or another material suitable for the manufacturing method. In particular, the carrier 123 has a larger band gap than the material of layer 108.

Figure 4:
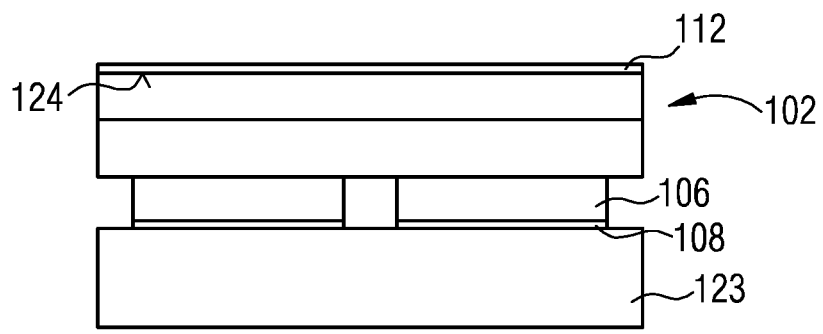

FIG. 4 shows an electrically conductive layer 112. The electrically conductive layer 112 is applied to a side of the semiconductor layer sequence 102 facing away from the carrier 123 after the growth substrate 101 has been removed.

The growth substrate 101, for example, is replaced by a laser lift-off by irradiation of laser radiation from the semiconductor layer sequence 102. Other processes of removing the growth substrate 101 are also possible such as grinding.

The electrically conductive layer 112, for example, is made of an n-conducting material. Alternatively, the electrically conductive layer 112 is an indium tin oxide layer. Other electrically conductive materials that are particularly optically transparent can also be used.

Figure 5:
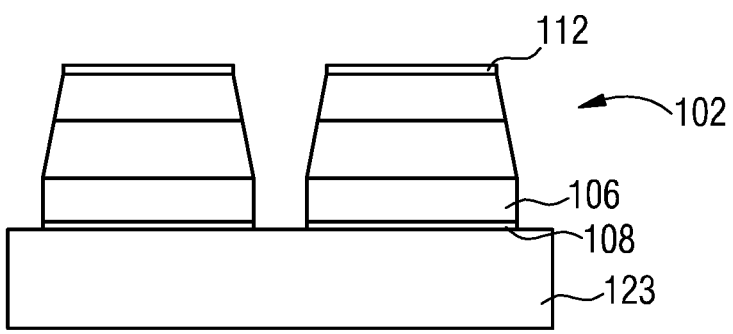

FIG. 5 shows the semiconductor layer sequence 102 that was separated into multiple individual components. In particular, one component is provided for each contact area of the plurality of contact areas 120. For example, as shown in FIG. 4, the layered structure is etched to obtain the structure of FIG. 5. Thus, the semiconductor layer sequence 102 is realized with an electrical contactability on both sides by the electrically conductive layer 112 and the metallization 106 by the layer 108.

Figure 6:
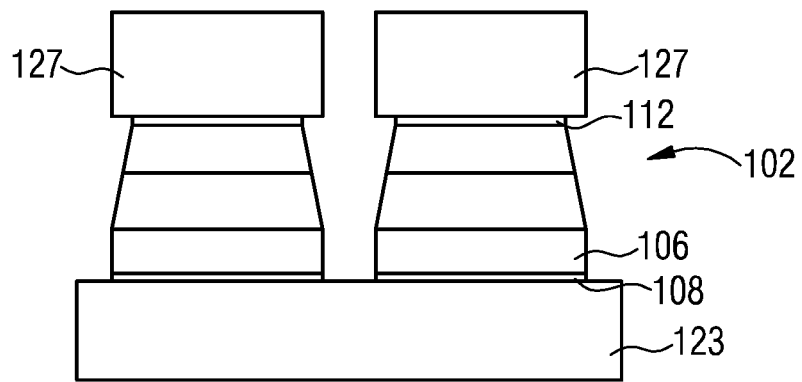

FIG. 6 shows a detachment tool 127 placed on the respective electrically conductive layer 112 by a lifting head. The detachment tool 127 exerts a holding force on the electrically conductive layer 112. The heads of the detachment tool 127 are dimensioned so that they can grip the relatively small components. The holding forces of the detachment tool are generated by adhesives, adhesive films, electrical voltage or other means.

FIG. 7 shows the irradiation of the laser beam 113 through the carrier 123. In particular, laser radiation is emitted in the infrared range. Laser radiation 113 is used, which the carrier 123 absorbs as little as possible. Laser radiation 113 is used, which is absorbed as well as possible by layer 108. For example, indium nitride has a band gap of 0.6 to 0.7 electron volts. Consequently, a laser with a wavelength of more than 1500 nm up to 1900 nm is used.

The laser radiation 113 decomposes the indium nitride into indium and nitrogen. Thus, an indium nitride laser lift-off is used that exploits the small band gap of indium nitride. The nitrogen becomes gaseous and thus contributes to the separation of a layer stack 114 from the carrier 123. It is also possible that the evaporation of nitrogen will completely detach the carrier 123 from the layer stack 114, as the gaseous nitrogen will repel the carrier 123.

Figure 8:
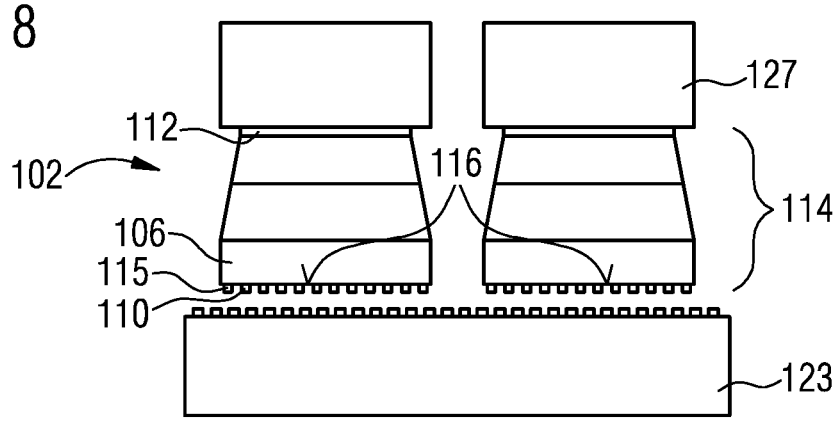

The detachment tool 127 therefore only has to carry at least the own-weight of the respective layer stack 114, as shown in FIG. 8, for example. The layer stack 114 consists of the electrically conductive layer 112, the semiconductor layer sequence 102, the metallization 106 and a coupling layer 115. The coupling layer 115 contains the further material 110, i.e. indium in particular according to the examples. The nitrogen has evaporated and the indium remains on side 116 of the metallization 106. If the gaseous nitrogen does not completely detach the carrier 123 from the metallization 106, only small forces are necessary to completely detach the carrier 123 from the metallization 106 by the detachment tool 127.

For example, the coupling layer 115 has a plurality of indium drops on the side 116 of the metallization 106. Indium has a comparatively low melting point of 156.6° C. The ambient temperature is kept above the melting point in the method step of FIG. 8 until coupling with the chip carrier 117 to keep the material of the coupling layer 115 liquid. For example, the temperature is kept above 156° C. to keep the indium of the coupling layer 115 liquid.

The liquid indium is then used for the electrical and mechanical coupling of the layer stack 114 with the chip carrier 117 as shown in FIG. 9. The chip carrier 117, for example, has electrically conductive areas or conductor paths used during operation for electrical contacting of the semiconductor chip. For example, the semiconductor chip and/or the layer stack 102 is coupled to an unrepresented electrical energy source by the electrically conductive regions of the chip carrier 117.

Between the chip carrier 117 and the metallization 106 in the optoelectronic semiconductor chip 100 the coupling layer 115 of the further material 110, in particular indium, is arranged. The coupling layer 115 that electrically and/or mechanically connects the metallization 106 to the chip carrier 117 is arranged on a surface 125 of the chip carrier 117. In particular, the electrical connection of layer stack 114 with chip carrier 117 is comparatively simple since the indium of layer 108 remains on the metallization in liquid form after laser lift-off and can be used directly to contact chip carrier 117.

The coupling layer 115 has a thickness 126 of less than 150 nm, in particular less than 100 nm, along a stacking direction 122 of the layer stack 114. The thickness 126 is less than or equal to the thickness 118 and therefore especially is 1 nm to 100 nm.

The device shown in FIG. 9 has two optoelectronic semiconductor chips 100 with a common chip carrier 117. Of course, it is also possible to form a single optoelectronic semiconductor chip 100 with a single semiconductor layer sequence 102 or more than two optoelectronic semiconductor chips 100 with a common chip carrier 117. The semiconductor layer sequence 102 and in particular the electrically conductive layer 112 are structured such that they have an edge length 121 transverse to the stacking direction 122. The edge length 121 is comparatively small, especially smaller than 150 µm, for example, 1 µm to 100 µm. Thus, comparatively small components are formed, in particular small light-emitting diodes.

By using layer 108 that contains nitrogen 109, it is also possible to manufacture small optoelectronic components using SMD processes. The laser lift-off by the laser beam 113 and the layer 108 allows a sufficient reduction of the holding forces of the detachment tool 127 so that even the relatively small layer stacks 114 can be reliably removed from the carrier 123.

My methods and chips are not limited by the description using the examples. Rather, this disclosure includes any new feature and any combination of features, which in particular includes any combination of features in the appended claims, even if the feature or combination itself is not explicitly mentioned in the claims or examples.

This application claims priority of DE 10 2017 103 164.2, the subject matter of which is incorporated herein by reference.

The invention claimed is:

1. A method of manufacturing an optoelectronic semiconductor chip comprising:
providing a growth substrate,
growing a semiconductor layer sequence on said growth substrate, said semiconductor layer sequence comprising an active layer that generates radiation and is arranged between a first and a second semiconductor region,
depositing a metallization on a side of the semiconductor layer sequence remote from the growth substrate,
depositing a layer on the metallization, the layer comprising a semiconductor containing nitrogen and a further material,
coupling a carrier to the layer on a side of the layer remote from the semiconductor layer sequence,
separating the growth substrate from the semiconductor layer sequence,
depositing an electrically conductive layer on a side of the semiconductor layer sequence facing away from the carrier,
separating the carrier from the layer by laser radiation through the carrier, thereby forming a layer stack with the metallization, the semiconductor layer sequence, the electrically conductive layer and a coupling layer comprising at least a part of the further material of the layer remaining on a side of the metallization remote from the semiconductor layer sequence after separating,
coupling the layer stack to a chip carrier by the coupling layer so that the chip carrier and the layer stack are electrically conductively coupled to one another by the further material, and
wherein depositing a layer comprises applying the layer including a material having a smaller band gap than the carrier.

2. The method according to claim 1, wherein the layer is applied with a thickness of 0.5 nanometers to 150 nanometers in the direction of the growth direction of the semiconductor layer sequence.

3. The method according to claim 1, wherein the layer is formed of indium nitride or comprises indium nitride or is formed of gallium nitride or comprises gallium nitride.

4. A layer structure comprising a semiconductor layer sequence with an active layer between a first semiconductor region and a second semiconductor region, wherein a metallization is applied on the first semiconductor region, a layer is applied on a side of the metallization facing away from the semiconductor layer sequence, the layer contains nitrogen and a further material, the metallization is applied over the entire surface of the first semiconductor region, and the layer is applied over the entire surface of the metallization.

5. The layer structure according to claim 4, wherein the further material is gallium or indium.

6. The layer structure according to claim 4, wherein the layer is applied with a thickness of more than 1 nm and less than 100 nm, and the thickness is measured along the growing direction.

7. A method of manufacturing an optoelectronic semiconductor chip comprising:
providing a growth substrate,
growing a semiconductor layer sequence on said growth substrate, said semiconductor layer sequence comprising an active layer that generates radiation and is arranged between a first and a second semiconductor region,
depositing a metallization on a side of the semiconductor layer sequence remote from the growth substrate,
depositing a layer on the metallization, the layer comprising a semiconductor containing nitrogen and a further material,
coupling a carrier to the layer on a side of the layer remote from the semiconductor layer sequence,
separating the growth substrate from the semiconductor layer sequence,
depositing an electrically conductive layer on a side of the semiconductor layer sequence facing away from the carrier,
separating the carrier from the layer by laser radiation through the carrier, thereby forming a layer stack with the metallization, the semiconductor layer sequence, the electrically conductive layer and a coupling layer comprising at least a part of the further material of the layer remaining on a side of the metallization remote from the semiconductor layer sequence after separating, and coupling the layer stack to a chip carrier by the coupling layer so that the chip carrier and the layer stack are electrically conductively coupled to one another by the further material, wherein at least one of i to vi:

i. the temperature of the coupling layer is maintained greater than the melting point of the further material after the carrier has been detached until it is coupled to the chip carrier;

ii. the layer is in direct contact with the carrier prior to detachment of the carrier;

iii. the carrier comprises a semiconductor material and is coupled to the layer by semiconductor-semiconductor bonding;

iv. the metallization is applied over the entire surface to the side of the semiconductor layer sequence facing away from the growth substrate, the layer is applied over its entire surface to the metallization, and subsequently the layer and the metallization are jointly removed region by region to form a plurality of contact regions;

v. the layer stack is structured before the carrier is detached so that it has an edge length transverse to the stacking direction of less than 150 micrometers;

vi. the laser radiation is irradiated at a wavelength which lies in the infrared range and which is absorbed by the layer.

\* \* \* \* \*